United States Patent
Wang et al.

(10) Patent No.: US 11,099,467 B2
(45) Date of Patent: Aug. 24, 2021

(54) MICRO LASER DIODE PROJECTOR AND ELECTRONICS APPARATUS

(71) Applicant: GOERTEK INC., Weifang (CN)

(72) Inventors: Zhe Wang, Weifang (CN); Quanbo Zou, Weifang (CN); Qinglin Song, Weifang (CN); Jialiang Yan, Weifang (CN); Yujing Lin, Weifang (CN); Xiaoyang Zhang, Weifang (CN)

(73) Assignee: GOERTEK INC., Weifang (CN)

( * ) Notice: Subject to any disclaimer, the term of this patent is extended or adjusted under 35 U.S.C. 154(b) by 33 days.

(21) Appl. No.: 16/483,156

(22) PCT Filed: Feb. 6, 2017

(86) PCT No.: PCT/CN2017/072997
§ 371 (c)(1),
(2) Date: Aug. 2, 2019

(87) PCT Pub. No.: WO2018/141112
PCT Pub. Date: Aug. 9, 2018

(65) Prior Publication Data
US 2020/0241407 A1    Jul. 30, 2020

(51) Int. Cl.
G03B 21/20    (2006.01)
G02B 26/08    (2006.01)
G02B 26/10    (2006.01)

(52) U.S. Cl.
CPC ....... G03B 21/2033 (2013.01); G02B 26/085 (2013.01); G02B 26/0841 (2013.01);
(Continued)

(58) Field of Classification Search
CPC ............ G03B 21/2033; G03B 21/2013; G02B 26/0841; G02B 26/085; G02B 26/0858; G02B 26/0866; G02B 26/101
(Continued)

(56) References Cited

U.S. PATENT DOCUMENTS

2006/0233208 A1* 10/2006 Takeda .................. G02B 26/101
372/38.02
2008/0100759 A1    5/2008 Tateno
(Continued)

FOREIGN PATENT DOCUMENTS

CN    101169577 A    4/2008
CN    101246301 A    8/2008
(Continued)

OTHER PUBLICATIONS

Translation of CN 104181761 A1 (Year: 2021).*

*Primary Examiner* — Jerry L Brooks
(74) *Attorney, Agent, or Firm* — Saliwanchik, Lloyd & Eisenschenk

(57) ABSTRACT

A micro laser diode projector comprises: an MEMS scanning device, which rotates around a first axis and a second axis that are orthogonal to each other; and a micro laser diode light source including at least one micro laser diode, wherein the micro laser diode light source is mounted on the MEMS scanning device and rotates around the first and second axes with the MEMS scanning device to project light to a projection screen. An electronics apparatus including the micro laser diode projector is also discussed.

8 Claims, 3 Drawing Sheets

(52) U.S. Cl.
 CPC ..... *G02B 26/0858* (2013.01); *G02B 26/0866* (2013.01); *G02B 26/101* (2013.01); *G03B 21/2013* (2013.01)

(58) Field of Classification Search
 USPC .......................................................... 353/98
 See application file for complete search history.

(56) References Cited

U.S. PATENT DOCUMENTS

| | | | |
|---|---|---|---|
| 2008/0257022 A1* | 10/2008 | Sachs | G01Q 10/04 73/105 |
| 2011/0128602 A1 | 6/2011 | Hamano et al. | |
| 2011/0249241 A1 | 10/2011 | Wakabayashi | |
| 2015/0234264 A1 | 8/2015 | Kurosaki | |
| 2017/0133818 A1* | 5/2017 | Cok | G02B 3/0006 |
| 2017/0196061 A1* | 7/2017 | Simin | H05B 45/10 |

FOREIGN PATENT DOCUMENTS

| | | | | |
|---|---|---|---|---|
| CN | 201247375 Y | | 5/2009 | |
| CN | 102105831 A | | 6/2011 | |
| CN | 104181761 A | * | 12/2014 | ............. G03B 21/14 |
| CN | 104865782 A | | 8/2015 | |
| CN | 105892199 A | | 8/2016 | |
| EP | 1211545 B1 | | 11/2007 | |

* cited by examiner

MICRO LASER DIODE PROJECTOR AND ELECTRONICS APPARATUS

CROSS REFERENCE TO RELATED APPLICATIONS

This application is a National Stage of International Application No. PCT/CN2017/072997, filed on Feb. 6, 2017, which is hereby incorporated by reference in its entirety.

FIELD OF THE INVENTION

The present invention relates to the technical field of micro laser diode, and more specifically, to a micro laser diode projector and an electronics apparatus.

BACKGROUND OF THE INVENTION

In the prior art, a pico-projector technology uses a micro scanner to form an image pixel by pixel. For example, the PicoP projector of the Microvision Inc. is one falling into this category. The micro scanner (or micro-scanning mirror) is a micro-opto-electromechanical system (MOEMS) in the category of micro-mirror actuators for dynamic light modulation. In the micro scanner, the modulatory movement of a single mirror can be either translatory or rotational around one or two axes, depending upon the type of micro scanner. In a PicoP projector, light beam from light source is directed to a micro scanner which includes a biaxial scanning mirror that scans the light beam in a rater pattern to form an image on a projection screen.

Another prior art projector is a Digital Light Processing (DLP) device which is a display device based on optical micro-electro-mechanical technology that uses a digital micro-mirror device. DLP is used in a variety of display applications from traditional static displays to interactive displays and also non-traditional embedded applications including medical, security, and industrial uses.

In a DLP projector, light is reflected by a mirror device and is projected to the display screen (a projection surface). The image is created by microscopically small mirrors laid out in a matrix on a semiconductor chip, known as a digital micro-mirror device (DMD). These mirrors are of a few micrometer. Each mirror represents one or more pixel in a projected image. These mirrors can be individually rotated rapidly to reflect light either through the lens or to a heat sink. Rapidly toggling the mirror between these two orientations (essentially by switching on and off of the device) produces gray-scales, which are controlled by the ratio of on-time to off-time.

The DLP system includes a light source, a DMD device, optical components to integrate, align and project light beam, a DLP controller, a light source driver and heat sink. The DMD device includes a large number of small mirrors corresponding to pixels of the projected image.

A micro laser diode (Micro-LD) is generally used as a light source for an optical communication device, a laser printer and the like. It can be a vertical cavity surface emitting laser (VCSEL). It can be formed on a growth substrate and then be transferred to a receiving substrate.

U.S. Pat. No. 9,122,060 B2 granted on Sep. 1, 2015 discloses a scanning image projector and method of driving scanning image projector, which is fully incorporated hereby as reference herein.

US patent application No. US 2016/0308333 A1 disclosed on Oct. 20, 2016 discloses a laser diode array, method of manufacturing the same, printer, and optical communication device, which is fully incorporated hereby as reference herein.

Therefore, there is a demand in the art that a new solution for processing the sensing signal of a sensor shall be proposed to address at least one of the problems in the prior art.

SUMMARY OF THE INVENTION

One object of this invention is to provide a new technical solution for

According to a first aspect of the present invention, there is provided a micro laser diode projector, comprising: an MEMS scanning device, which rotates around a first axis and a second axis that are orthogonal to each other; and a micro laser diode light source including at lease one micro laser diode, wherein the micro laser diode light source is mounted on the MEMS scanning device and rotates around the first and second axes with the MEMS scanning device to project light to a projection screen.

Alternatively or optionally, the at lease one micro laser diode includes a red micro laser diode, a green micro laser diode and a blue micro laser diode.

Alternatively or optionally, the micro laser diode light source includes a main micro laser diode and a corresponding backup micro laser diode, and the backup micro laser diode is switched on in case that the main micro laser diode is failed.

Alternatively or optionally, the micro laser diode light source projects light to the projection screen to form an image on the projection screen in a line-scan manner.

Alternatively or optionally, the micro laser diode projector further comprises: a MEMS control unit, which drives the MEMS scanning device to rotate around the first axis and the second axis; and a laser diode control unit, which drives the micro laser diode light source.

Alternatively or optionally, the micro laser diode light source includes a main micro laser diode and a corresponding backup micro laser diode, and the main micro laser diode and the backup micro laser diode are connected to the micro laser diode control unit via a common signal line.

Alternatively or optionally, the laser diode control unit provides the main micro laser diode and the backup micro laser diode with a driving current within a nominal current of any of the main micro laser diode and the backup micro laser diode.

Alternatively or optionally, the MEMS scanning device is a MEMS scanner and the micro laser diode light source is mounted on top of a micro mirror of the MEMS scanner.

Alternatively or optionally, the MEMS scanning device is driven by at least one of an electrostatic drive mechanism, an electromagnetic drive mechanism, a piezoelectric drive mechanism and an electrothermal drive mechanism.

According to a second aspect of the present invention, there is provided an electronics apparatus, comprising the micro laser diode projector according to any embodiment of this disclosure.

Compared with the prior art DLP, an embodiment can downsize a projector.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
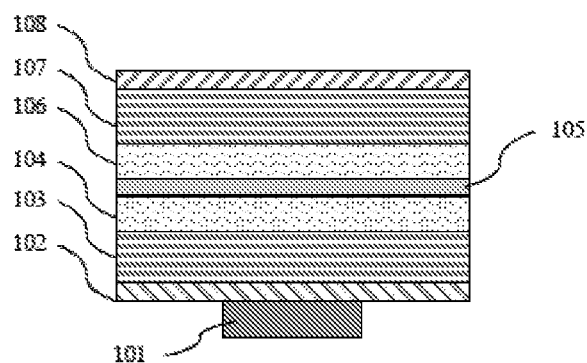
FIG. 1 is a schematic diagram showing a micro laser diode.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

The embodiments and examples according to this invention will be described below with reference to the drawings.

FIG. 1 is a schematic diagram showing a micro laser diode.

The micro laser diode can be a vertical cavity surface emitting laser. As shown in FIG. 1, the micro laser diode can comprise a lower metal electrode 101, a lower contact layer 102, a lower Bragg reflector 103, a lower spacer 104, an active layer (quantum well) 105, an upper spacer 106, an upper Bragg reflector 107 and an upper contact layer 108.

Figure 2:
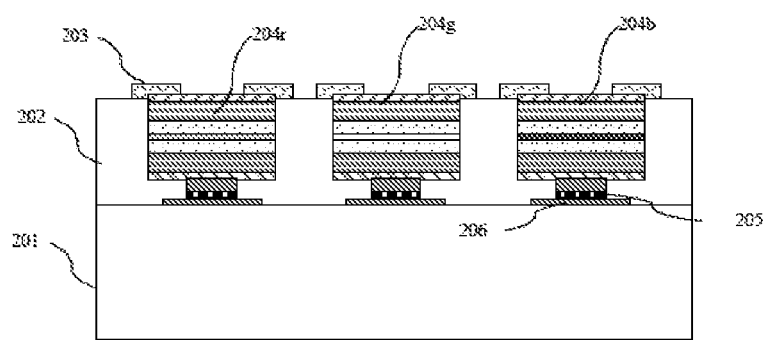
FIG. 2 is a schematic cross-sectional view of a pixel with red, green and blue laser diodes.

FIG. 2 is a schematic cross-sectional view of a pixel with red, green and blue laser diodes.

As shown in FIG. 2, the pixel is formed on a substrate 201. The substrate 201 can be a micro mirror 201 of a micro scanner.

The pixel may include a red micro laser diode 204r, a green micro laser diode 204g, and a blue micro laser diode 204b. Each of them can be fabricated on a growth substrate and then be transferred to the top of the micro mirror 201. A dielectric filler 202 is filled among the micro laser diodes. For example, the red, green and blue laser diodes 204r, 204g, 204b are bonded to the anodes 206 on the substrate 201 via a bonding layer 205. A cathode s 203 may be formed on top of the micro laser diodes. For example, the micro laser diode may be 10-100 um in diameter.

In an embodiment, the dielectric filler 202 may be lower then the top of the micro laser diodes 204r, 204g, 204b and be above the active layers of them. At least one part of top electrodes (such as the cathodes) is formed at the side surfaces of the micro laser diodes. In this regard, the thermal dispersion of the micro laser may be improved. Furthermore, the upper contact layer of the micro laser diode may be omitted. This can further improve the light efficiency of the micro laser diode.

The micro laser diode and/or the pixel shown in FIGS. 1 and 2 are just illustrative and will not limit the scope of this invention. The micro laser diode can be of another structure as long as it can be used as a light source for a projector. One or more pixels can be formed on the substrate 201. One pixel may just include one micro laser diode, for example.

Figure 3:
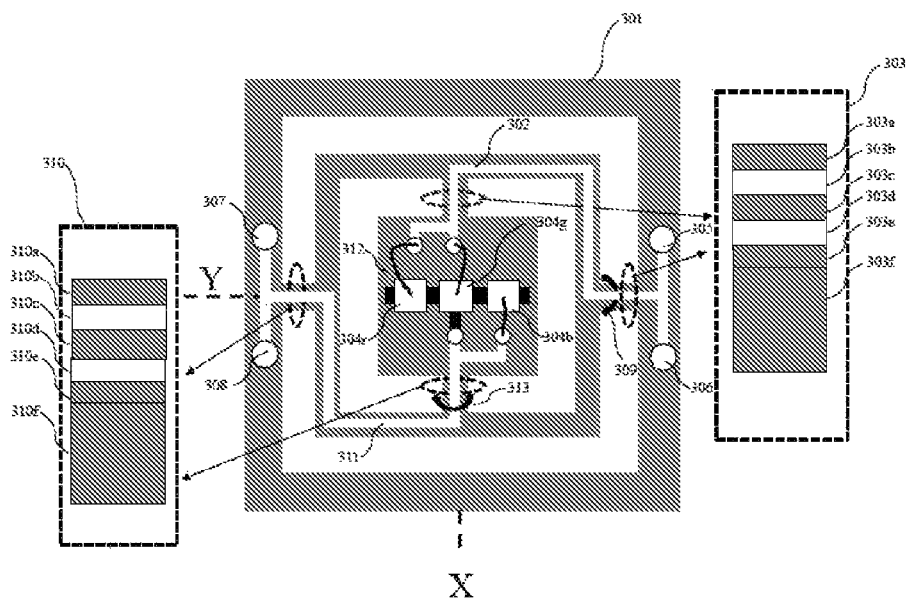
FIG. 3 is a schematic diagram showing a structure of a micro laser diode projector according to an embodiment.

FIG. 3 is a schematic diagram showing a structure of a micro laser diode projector according to an embodiment.

As shown in FIG. 3, the micro laser diode projector comprises a MEMS scanning device 301 and a micro laser diode light source 312.

The MEMS scanning device 301 can rotate around a first axis (X axis in FIG. 3) and a second axis (Y axis in FIG. 3) that are orthogonal to each other. As shown in FIG. 3, the MEMS scanning device 301 can rotate in the directions of 309 and 313. For example, the MEMS scanning device 301 is driven by at least one of an electrostatic drive mechanism, an electromagnetic drive mechanism, a piezoelectric drive mechanism and an electrothermal drive mechanism.

The micro laser diode light source 312 includes at lease one micro laser diode 304r, 304g, 304b. The micro laser diode light source 312 is mounted on the MEMS scanning device and can rotate around the first and second axes with the MEMS scanning device 301 to project light to a projection screen.

In this embodiment, the projector may form an image in a scan-manner so that the size of the projector may be lowered. So, it may be easier to integrated it into an electronics apparatus.

The micro laser diode light source 312 may include the pixel as shown in FIG. 2. The at lease one micro laser diode includes a red laser diode 304r, a green laser diode and a blue laser diode.

It shall be appreciated by a person skilled in the art that although it is shown in FIG. 3 that the micro laser diode light source 312 includes three micro laser diodes 304r, 304g, 304b, it can include less or more micro laser diodes. For example, it can include just one micro laser diode to project a mono-color image. Alternatively, it can include a plurality of pixels as shown in FIG. 2 so that it can form multiple lines of an image at a time and thus the efficiency of image forming may be improved.

For example, the MEMS scanning device 301 is a MEMS scanner and the micro laser diode light source 312 is mounted on top of a micro mirror of the MEMS scanner 301. For example, the footprint of the MEMS scanner is preferably in a range of 2 mm*2 mm~5 mm*5 mm.

For example, a red signal terminal 305, a green signal terminal 306, a blue signal terminal 307 and a ground terminal 308 are provided on the MEMS scanning device 301. The red, green, blue signal terminals 305, 306, 307 are used to receive red, green and blue control signal, respectively. The ground terminal 308 is connected to the ground.

A first signal path 302 and a second signal path 311 are provided to connect the terminals 305, 306, 307 and 308 with the micro laser diode light source 312, respectively. The first signal path 302 and the second signal path 311 run through the torsion beams 303, 310 of the MEMS scanning device 301. The first signal path 302 and the second signal path 311 may include at least one conductive layer to connect the terminals with the micro laser diode light source 312. For example, the cross-section views of the torsion beams 303, 310 are shown in the dashed boxes. As shown in the dashed box 303, the torsion beam 303 includes a silicon substrate 303f, a dielectric insulation layer 303e, an aluminum layer 303d for green control signal, a dielectric insulation layer 303c, an aluminum layer 303b for red control signal and a dielectric insulation layer 303a. As shown in the dashed box 310, the torsion beam 310 includes a silicon substrate 310f, a dielectric insulation layer 310e, an aluminum layer 310d for ground, a dielectric insulation layer 310c, an aluminum layer 310b for blue control signal and a dielectric insulation layer 310a.

For example, in FIG. 3, the three micro laser diodes 304r, 304g, 304b share a common ground. Each of the three micro laser diodes 304r, 304g, 304b is wire bonded to a predefined electrical pad connected to a corresponding terminal 305, 306, 307 or 308 via a conductive layer of the corresponding signal path 302 or 311.

In the prior art, a projector such as a Digital Light Processing device requires an external light source other than a micro mirror thereof, which limits the minimization of the projection system.

In an embodiment of this disclosure, the micro laser diode is mounted on the micro scanner, and thus the size thereof may be lowered.

In addition, the Digital Light Processing device includes a digital micro-mirror device, in which each micro mirror corresponds to one pixel. So, it is difficult to downsize the scale of the projector in this respect.

In an embodiment of this disclosure, the projector may form an image in a scan manner. So, the number of required micro laser diodes may be reduced. Accordingly, the size of the projector may also be reduced.

In additional, compared with the prior art Digital Light Processing device which utilizes micro mirrors to reflect the light from an external light source, since the micro laser diode is directly mounted on the MEMS scanning device, degradations such as phase changes of the beam profile reflected by the micro mirrors, which is caused by the micro mirror plate dynamic deformation, can be eliminated. The quality of the formed image may be improved.

Figure 4:
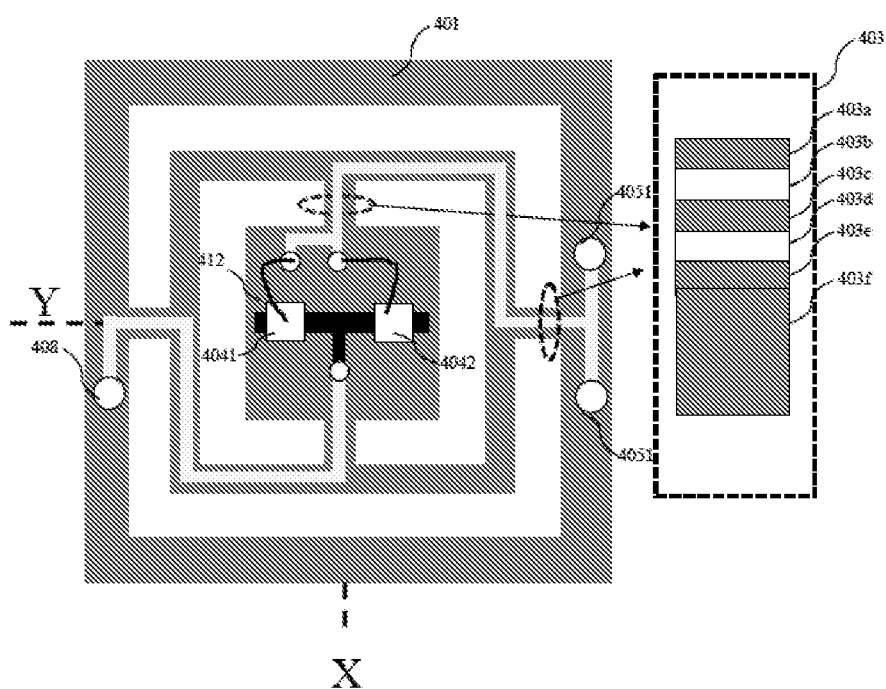
FIG. 4 is a schematic diagram showing a structure of a micro laser diode projector according to another embodiment.

FIG. 4 is a schematic diagram showing a structure of a micro laser diode projector according to another embodiment.

In FIG. 4, the micro laser diode light source 412 includes a main laser diode 4041 and a corresponding backup laser diode 4042. The backup laser diode 4042 will be switched on in case that the main laser diode 4041 is failed. In this regard, it provides a protection mechanism.

As shown in FIG. 4, signal terminals 4051, 4052 are provided on the MEMS scanning device 401 to receive control signals for the main laser diode 4041 and the backup laser diode 4042, respectively. They are connected to the micro laser diode light source 412 via a signal path.

A cross-section view of the torsion beams 403 is shown in the dashed box. As shown in the dashed box 403, the torsion beam 403 includes a silicon substrate 403f, a dielectric insulation layer 403e, an aluminum layer 403d for a control signal of the backup laser diode 4042, a dielectric insulation layer 403c, an aluminum layer 403b for a control signal of the main laser diode 4041 and a dielectric insulation layer 403a.

A ground terminal 408 is connected with the ground of the micro laser diode light source 412 via a ground signal path.

The other parts of the micro laser diode projector may be similar to that of FIG. 3 and thus the detailed description thereof is omitted.

Although only one main laser diode 4041 and one backup laser diode 4042 are shown in FIG. 4, it can be appreciated by a person skilled in the art that the micro laser diode light source 412 may include more main laser diodes and corresponding backup laser diodes.

Figure 5:
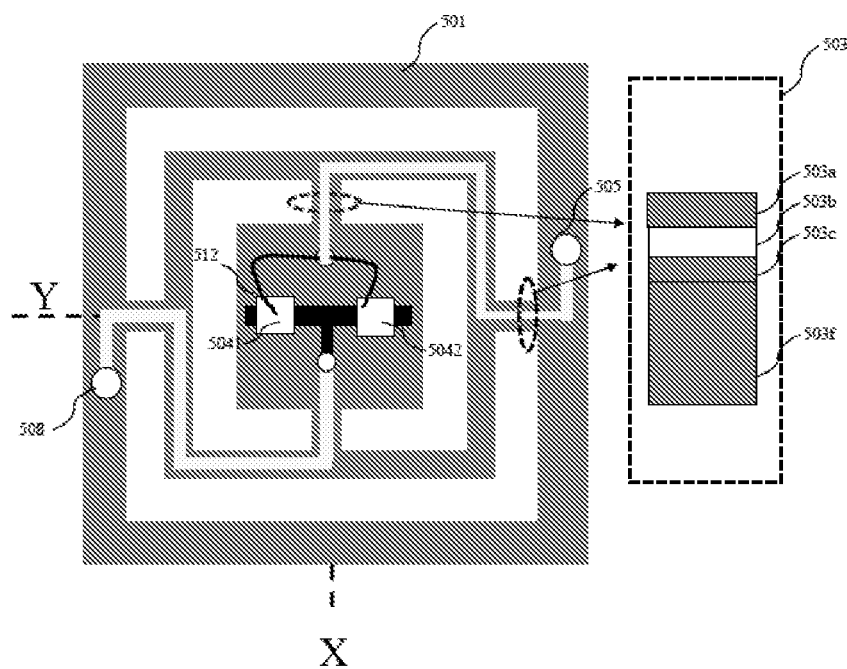
FIG. 5 is a schematic diagram showing a structure of a micro laser diode projector according to another embodiment.

FIG. 5 is a schematic diagram showing a structure of a micro laser diode projector according to another embodiment.

In FIG. 5, the micro laser diode light source 512 includes a main laser diode 5041 and a corresponding backup laser diode 5042. The main laser diode 5041 and the backup laser diode 5042 are connected to the laser diode control unit via a common signal line. Here, the common signal line means they share the same control signal.

As shown in FIG. 5, signal terminals 505 is provided on the MEMS scanning device 501 to receive a control signal for the main laser diode 5041 and the backup laser diode 5042. It is connected to the micro laser diode light source 512 via a signal path. A cross-section view of the torsion beams 503 is shown in the dashed box. As shown in the dashed box 503, the torsion beam 503 includes a silicon substrate 503f, a dielectric insulation layer 503c, an aluminum layer 503b for a control signal and a dielectric insulation layer 503a.

In this embodiment, the main laser diode 5041 and the backup laser diode 5042 share the same control signal. In this regard, the burden of each diode may be lowered during normal operation. In case of a failure of any of the two diodes, another diode may automatically provide a "warm-up" backup or protection. Alternatively, in some situation, said another diode may receive a higher power during the failure and thus the degradation of image forming during a failure may be relieved.

For example, the micro laser diode projector includes a laser diode control unit to provide a control signal for the micro laser diode light source 512. For example, the laser diode control unit provides the main laser diode 5041 and the backup laser diode 5042 with a driving current within a nominal current of any of the main laser diode and the backup laser diode.

In FIG. 5, a ground terminal 508 is connected with the ground of the micro laser diode light source 512 via a ground signal path.

The other parts of the micro laser diode projector may be similar to that of FIG. 3 and thus the detailed description thereof is omitted.

Although only one main laser diode 5041 and one backup laser diode 5042 are shown in FIG. 5, it can be appreciated by a person skilled in the art that the micro laser diode light source 512 may include more main laser diodes and corresponding backup laser diodes.

Figure 6:
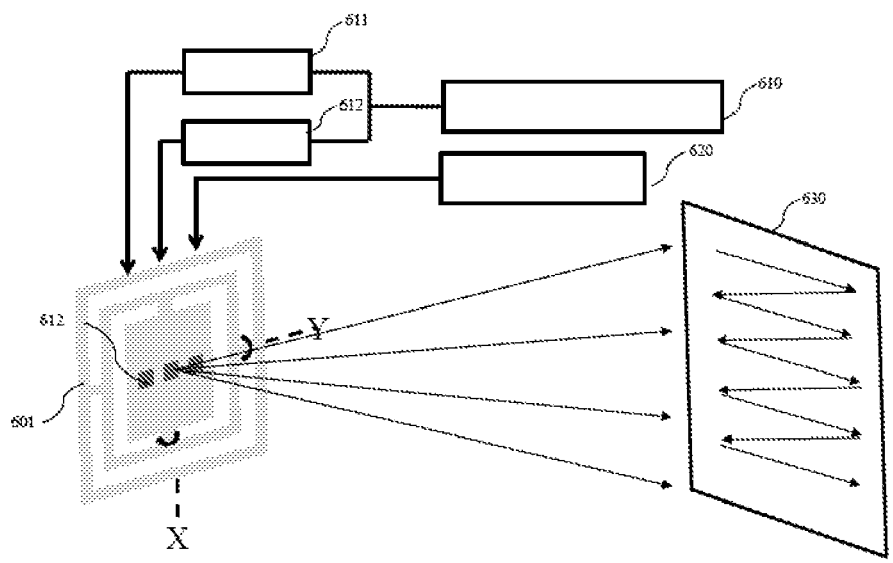
FIG. 6 is a schematic diagram showing a structure of a micro laser diode projector according to another embodiment.

FIG. 6 is a schematic diagram showing a structure of a micro laser diode projector according to another embodiment.

As shown in FIG. 6, the micro laser diode projector includes a MEMS control unit 610 and a laser diode control unit 620. The MEMS control unit 610 drives the MEMS scanning device 601 to rotate around the first axis and the second axis. The laser diode control unit 620 drives the micro laser diode light source 612.

The MEMS control unit 610 may include an X drive unit 611 and a Y drive unit 612, which drive the MEMS scanning device 601 around the X and Y directions, respectively.

For example, the micro laser diode light source 612 projects light to the projection screen 630 to form an image on the projection screen 610 in a line-scan manner. In this manner, the size of the projector may be lowered and it may be easier to integrate it into an electronics apparatus.

Figure 7:
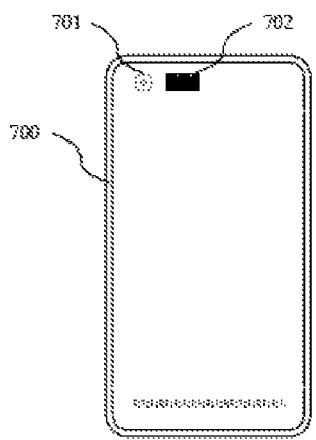
FIG. 7 is a schematic diagram showing an electronics apparatus according to another embodiment.

FIG. 7 is a schematic diagram showing an electronics apparatus according to another embodiment.

As shown in FIG. 7, the electronics apparatus 700 may comprise a micro laser diode projector 702. The electronics apparatus 700 may be a smart phone, a pad, a computer and so on. The micro laser diode projector 702 may be one as described above. It can be a display component for the electronics apparatus 700.

In an example, the electronics apparatus 700 further comprises a camera 701. The camera 701 may be used to capture an action on the projection image projected by the micro laser diode projector 702. The camera 701 and the projector 702 may constitute a virtue control device for the electronics apparatus 700. The electronics apparatus 700 may process the action captured by the camera 702 as an input control signal.

Although some specific embodiments of the present invention have been demonstrated in detail with examples, it should be understood by a person skilled in the art that the above examples are only intended to be illustrative but not to limit the scope of the present invention.

What is claimed is:

1. A micro laser diode projector, comprising:
   a MEMS scanning device, which rotates around a first axis and a second axis that are orthogonal to each other;
   a micro laser diode light source including at lease one micro laser diode, wherein the micro laser diode light source is mounted on the MEMS scanning device and rotates around the first and second axes with the MEMS scanning device to project light to a projection screen; and
   a laser diode control unit, which drives the micro laser diode light source,
   wherein the micro laser diode light source projects light to the projection screen to form an image on the projection screen in a line-scan manner,
   wherein the micro laser diode source includes a main micro laser diode and a corresponding backup micro laser diode, and the main micro laser diode and the corresponding backup micro laser diode are connected to the micro laser diode control unit via a common signal line, and
   wherein a burden of each of the main micro laser diode and the corresponding backup micro laser diode is lowered during normal operation, and in case of a failure of either diode of the main micro laser diode and the corresponding backup micro laser diode, the other diode of the main micro laser diode and the corresponding backup micro laser diode automatically provides a warm-up backup or protection.

2. The micro laser diode projector according to claim 1, wherein the at lease one micro laser diode includes a red micro laser diode, a green micro laser diode and a blue micro laser diode.

3. The micro laser diode projector according to claim 1, wherein the micro laser diode light source includes a main micro laser diode and a corresponding backup micro laser diode, and the backup micro laser diode is switched on in case that the main micro laser diode is failed.

4. The micro laser diode projector according to claim 1, further comprising: MEMS control unit, which drives the MEMS scanning device to rotate around the first axis and the second axis.

5. The micro laser diode projector according to claim 1, wherein the laser diode control unit provides the main micro laser diode and the backup micro laser diode with a driving current within a nominal current of any of the main micro laser diode and the backup micro laser diode.

6. The micro laser diode projector according to claim 1, wherein the MEMS scanning device is a MEMS scanner and the micro laser diode light source is mounted on top of a micro mirror of the MEMS scanner.

7. The micro laser diode projector according to claim 1, wherein the MEMS scanning device is driven by at least one of an electrostatic drive mechanism, an electromagnetic drive mechanism, a piezoelectric drive mechanism and an electrothermal drive mechanism.

8. An electronics apparatus, comprising the micro laser diode projector according to claim 1.

* * * * *